United States Patent [19]

Kirs et al.

[11] Patent Number: 5,108,574
[45] Date of Patent: Apr. 28, 1992

[54] CYLINDRICAL MAGNETRON SHIELD STRUCTURE

[75] Inventors: Milan R. Kirs, Lafayette, Calif.;
Abraham I. Belkind, North
Plainfield, N.J.; J. Randall Kurie,
Livingston, N.J.; Zoltan Orban,
Franklin Park, N.J.; Carolynn
Boehmler, Vacaville, Calif.

[73] Assignee: The BOC Group, Inc., New Providence, N.J.

[21] Appl. No.: 647,391

[22] Filed: Jan. 29, 1991

[51] Int. Cl.⁵ ............................................. C23C 14/34
[52] U.S. Cl. ...................... 204/298.22; 204/192.12;
204/298.21; 204/298.11
[58] Field of Search ................ 204/298.11, 298.16,
204/298.19, 298.2, 298.21, 298.22, 298.23,
298.28, 192.12

[56] References Cited

U.S. PATENT DOCUMENTS

| | | | |
|---|---|---|---|
| 4,356,073 | 10/1982 | McKelvey | 204/298.22 X |
| 4,410,407 | 10/1983 | Macaulay | 204/298.11 X |
| 4,417,968 | 11/1983 | McKelvey | 204/298.22 X |
| 4,422,916 | 12/1983 | McKelvey | 204/298.22 X |
| 4,443,318 | 2/1984 | McKelvey | 204/298.23 |
| 4,444,643 | 4/1984 | Garrett | 204/298 |
| 4,466,877 | 8/1984 | McKelvey | 204/298 |
| 4,498,969 | 2/1985 | Ramachandran | 204/298 |
| 4,746,417 | 5/1988 | Ferenbach et al. | 204/298 |
| 4,872,964 | 10/1989 | Suzuki et al. | 204/298 |

FOREIGN PATENT DOCUMENTS 1239115  7/1988  Canada.
3229969  4/1983  Fed. Rep. of Germany .................... 204/298.22
63-149374  6/1988  Japan.

OTHER PUBLICATIONS

Wright et al., "Design . . . magnetron", J. Vac. Sci. Technol. A, vol. 4, No. 3, May/Jun. 1986, pp. 388-392.
Chapman, "Practical Aspects of Sputtering Systems", pp. 196-198, Chapter 6: "Sputtering", in *Glow Discharge Processes*, John Wiley & Sons, 1980.

*Primary Examiner*—Nam Nguyen
*Attorney, Agent, or Firm*—David A. Draegert; Robert I. Pearlman

[57] ABSTRACT

A rotating cylindrical sputtering target surface as part of a magnetron has cylindrical shields adjacent each end of the target to prevent arcing that undesirably occurs when certain materials are being sputtered, particularly dielectrics. If two or more rotating targets are employed in a single magnetron system, each is similarly shielded. In a preferred form, the target is provided with a single cylindrical shield that is cut away for a significant portion of the distance around the cylinder to provide an opening through which a sputtering region of the target is accessible, while maintaining shielding of the target end regions. This preferred shield is rotatable in order to allow the position of the sputtering activity to be selected.

12 Claims, 2 Drawing Sheets

CYLINDRICAL MAGNETRON SHIELD STRUCTURE

BACKGROUND OF THE INVENTION

This invention relates generally to magnetrons of a type using rotating cylindrical sputtering targets, and, more specifically, to structures and techniques for minimizing arcing in such magnetrons.

Cylindrical magnetrons are becoming widely used for depositing films on substrates. An example is the deposition of a stack of dielectric and metal layers on a surface of a glass substrate for the purpose of filtering out a portion of solar energy from passing through the glass. Such a substrate is positioned within a vacuum chamber containing at least one, and usually two, rotating cylindrical targets containing sputtering material on an outer surface thereof. Both inert and reactive gases are generally introduced into the chamber. A voltage applied to the sputtering target, with respect to either the vacuum chamber enclosure or a separate anode, creates a plasma that is localized along a sputtering zone of the target by stationary magnets positioned within the target. Material is sputtered off the target surface and onto the substrate by bombarding the target with electrons and ions of the plasma as it passes through the stationary sputtering zone.

The magnets are usually of a permanent magnet type, arranged along a line within the rotating cylindrical target and held against rotation with the target. The sputtering zone is created by the magnets along substantially the entire length of the cylindrical sputtering target and extending only a small circumferential (radial) difference around it. Traditionally, the magnets are arranged so that the sputtering zone exists at the bottom of the cylindrical target, facing a substrate being coated directly beneath.

Although deposition of the film is desired to take place only on the substrate, it is also deposited on other surfaces within the reactive chamber. This can create a problem in many situations, especially when certain dielectrics are being deposited as the film. For example, if the target surface is silicon or aluminum and the reactive gas is oxygen, silicon dioxide is deposited on the target surface, surfaces of target supporting structures, and the like, as well as on the substrate that is intended to be coated. After a certain build-up of dielectric material on internal vacuum chamber surfaces has occurred over time, arcing to those surfaces can begin. Arcing is undesirable since it generates particles that contaminate the film being deposited on the substrate, and overloads the power supply that creates the plasma through an electrical connection with the sputtering target surface and the vacuum chamber walls or some other anode.

An advantage of a rotating cylindrical sputtering target is that such a film deposited on the target is subjected to being sputtered away as the target surface passes through the sputtering zone, thus counteracting the undesirable film build-up. This is to be contrasted with a planar magnetron sputtering surface that has a fixed sputtering zone, creating a well defined "racetrack" in the sputtering surface, while causing a build-up of an arc causing film on surrounding portions of the planar target. As a result, shields that are used in planar magnetrons to cover such unused sputtering surface portions are believed to be unnecessary in rotary cylindrical magnetrons because of their self-cleaning characteristic. However, undesirable arcing still occurs in rotary magnetrons, under certain circumstances.

Therefore, it is a principal object of the present invention to provide a mechanism and technique for minimizing such arcing.

SUMMARY OF THE INVENTION

This and additional objects are accomplished by the present invention, wherein, briefly and generally, a cylindrical shield is provided around and spaced apart from at least a portion of the sputtering target outside of said sputtering zone. In a preferred form, the shield is a cylindrical tube positioned to surround the target and at least portions of adjacent supporting structures, and having a window opened in it to expose the sputtering zone so that the target surface is bombarded by electrons and ions of the plasma as it is rotated through that zone. The shield does not rotate with the cylindrical target. In systems that provide for the sputtering zone to be circumferentially positionable around the target by rotation of its magnets, the shield is also made rotatable so that its window may follow the sputtering zone to its new position.

Such a shield has been found to be beneficial in two primary respects. First, it has been found that the self-cleaning attribute of a rotating sputtering target generally does not extend to the far ends of the target cylinder since the sputtering zone controlled by the magnets within the cylinder does not extend completely to its ends. An abrupt termination of the permanent magnets within the target cylinder creates some discontinuities in the sputtering zone at the ends of the cylinder, and thus in the character of the plasma itself. Since the self-cleaning attribute of a rotating target does not fully extend to these end portions, the shield of the present invention extends completely around the sputtering cylinder at its ends. Further, the shield may be extended to cover portions of rotating target support structures adjacent its ends which are particularly susceptible to undesirable film build-up because of their proximity to the sputtering surface and plasma.

A second benefit of the shield comes from covering a central portion of the length of the sputtering target cylinder, despite the self-cleaning attribute of a rotating magnetron mentioned above. It has been found that there are circumstances where an undesired dielectric or other film deposited on portions of the target outside of the sputtering zone are not completely removed when those surface portions again pass through the sputtering zone. Further, there are circumstances where it has been found desirable to be able to cover a portion of the cylindrical target surface during co-sputtering; that is, in a situation where two rotating cylindrical target structures are adjacent one another and material from at least one of them is being sputtered onto the surface of another before being resputtered onto a substrate. Such co-sputtering techniques are described in copending patent application Ser. No. 549,392, filed Jul. 6, 1990, abandoned, which is incorporated herein by this reference. It is the ability to cover a portion of the target during such co-sputtering that is provided by the present invention.

Additional objects, features and advantages of the present invention will become apparent from the following description of a preferred embodiment thereof, which description should be taken in conjunction with the accompanying drawings.

DESCRIPTION OF A PREFERRED EMBODIMENT

Figure 1:
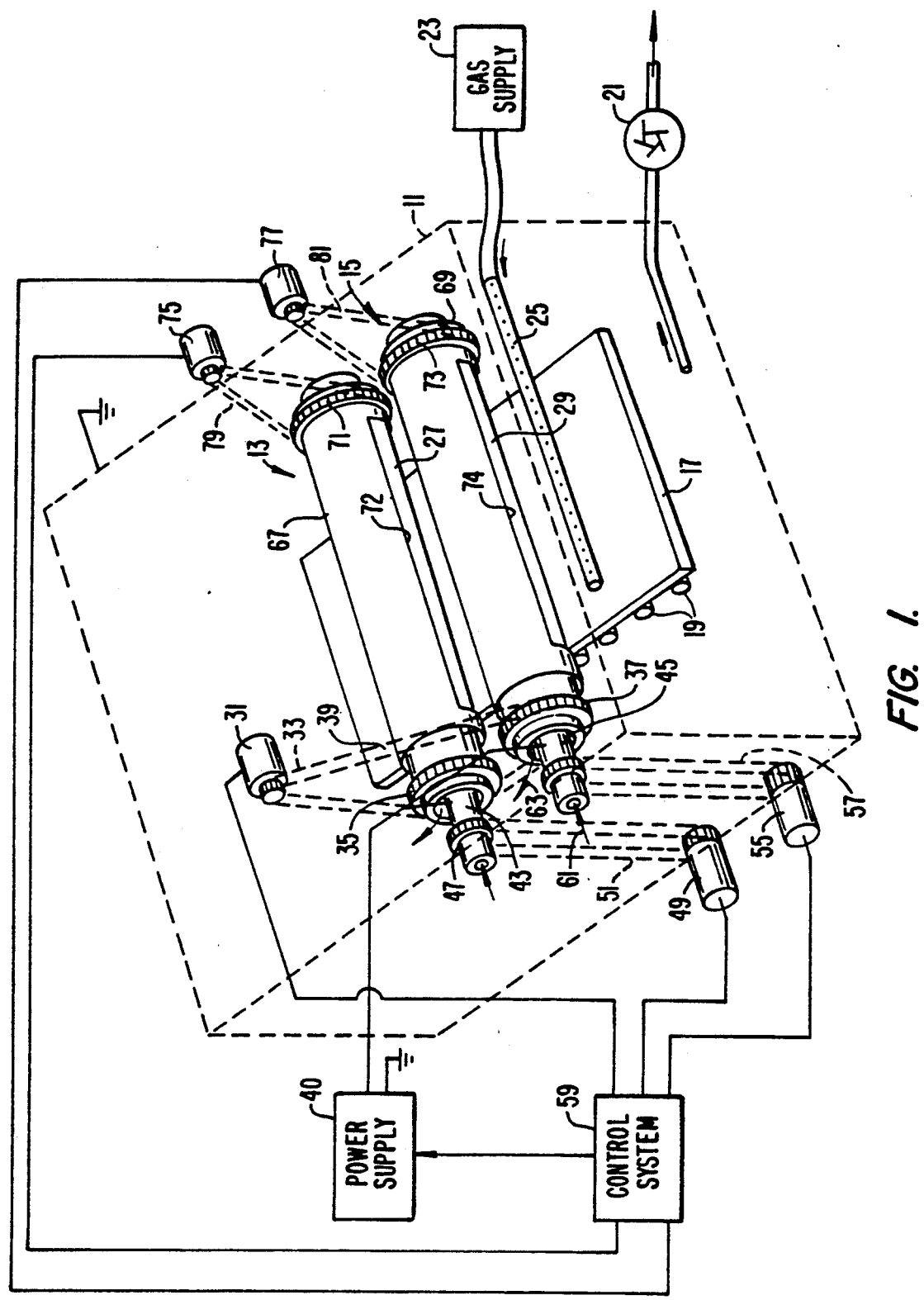
FIG. 1 schematically illustrates a dual cylindrical sputtering target magnetron that utilizes the improvement of the present invention.

Referring initially to FIG. 1, an entire magnetron system utilizing the present invention is generally described before the details of the invention's preferred implementation are explained. A box 11, shown in dotted outline, indicates metallic walls of a vacuum chamber in which the sputtering occurs. Within that chamber are two rotatable cylindrical target structures 13 and 15 which are held by the frame 11 in a manner to be rotatable about their longitudinal axes. The target structures 13 and 15 are generally held with their axes parallel to one another, but that is not a requirement. Further, although two target structures are illustrated in FIG. 1, many applications need only employ one such target, and other applications can benefit by having more than two. However, the use of two target structures 13 and 15 is most common for most applications.

The magnetron of FIG. 1 is shown to have a substrate 17 held by a support structure 19. The support structure 19 may be rollers to allow the substrate 17 to be passed through the vacuum chamber in a continuous process. A vacuum is drawn within the vacuum chamber by an appropriate pumping system 21. One or more gases are provided by a supply 23 to the vacuum chamber by some convenient delivery system, such as a perforated tube 25 positioned across the vacuum chamber. The particular gases utilized depend primarily upon the film desired to be deposited on the substrate 17.

Cylindrical pieces 27 and 29 of sputtering material provided as part of the target structures 13 and 15, respectively, are generally made of the same material but can be of different materials, depending upon the nature of the film to be deposited on the substrate 17. An electric motor source 31, positioned outside the vacuum chamber, rotates the target assemblies by rotating, through a toothed belt 33, pulleys 35 and 37 which are attached to respective spindles 39 and 41. The sputtering materials 27 and 29 are attached to the respective spindles 39 and 41 in order to rotate with them.

A plasma is created within the vacuum chamber by applying a negative voltage from a power supply 40 to the sputtering surfaces with respect to the vacuum chamber metal frame 11 or some other anode, which is usually connected to ground potential. The plasma is positioned adjacent a sputtering zone of the cylindrical sputtering targets 27 and 29, controlled by the positioning of their respective magnets (not shown in FIG. 1). These magnets are positioned along the length of their respective cylindrical sputtering targets 27 and 29, while extending a small circumferential, or radial, distance therearound. These magnets are most conveniently held within the sputtering targets 27 and 29 by attachment to respective coolant conduits 43 and 45. These cooling conduits are provided as part of their respective target assemblies in a manner to be rotatable independently of rotation of their respective cylindrical sputtering targets 27 and 29.

Thus, the position of the magnets in each target assembly, and thus the position of the sputtering zone of each, is controlled by rotation of the these cooling conduits. Specifically, a pulley 47 is attached to the conduit 43 and driven from an electrical motor source 49 outside the vacuum chamber by a toothed belt 51. Similarly, a pulley 53 is attached to the coolant conduit 45 and is controlled as to rotatable position by an electrical motor source 55 positioned outside the vacuum chamber and connected with it by a toothed belt 57. The motor sources 49 and 55 are preferably stepper motors which thereby hold their respective conduits 43 and 45 in selected positions and keep them from rotating with their respective sputtering targets 27 and 29.

A cooling liquid supply and exhaust system (not shown) outside the vacuum chamber provides coolant into the center of each of the conduits 43 and 45, as indicated by an arrow 61, and exhausts the heated coolant from a space between the outside of the conduits and an interior surface of the spindles, as indicated by an arrow 63. An electrical and electronic control system 59 operates to control the power supply 40 and various parameters of the magnetron system being shown, including motors 31, 49 and 55.

The improvement of the present invention is implemented in the system of FIG. 1 by providing cylindrically shaped shields 67 and 69 around and spaced from each of the cylindrical target surfaces 27 and 29, respectively. Additionally, the cylinders extend in length beyond the end of the sputtering material in order to cover exposed surfaces of adjacent spindles and their supporting structures. Window openings 72 and 74, in the respective shields 67 and 69, are large enough to expose the sputtering zone. These openings do not extend the full length of the cylindrical shields 67 and 69, however, leaving covered completely around their circumferences the respective sputtering surfaces 27 and 29 for a distance immediately adjacent the opposite ends of the sputtering material cylinder.

If the sputtering zone defining magnets inside the target assemblies are held fixed, the shields 67 and 69 are then most easily held with their windows in a fixed position. However, if the magnets are made to be rotatable, as described in the embodiment of FIG. 1, such as is useful in the co-sputtering application previously mentioned, it is desirable to be able to controllably rotate the shields 67 and 69 so that their respective openings 72 and 74 follow the moving sputtering zone. The extend of shield rotation is made to be at least as great as the extend of magnet rotation. This allows the radial extent of the openings 72 and 74 to be kept small and thus maximize the coverage of the sputtering surface outside the sputtering zone. On the other hand, it is possible to make the radial extent of the openings 72 and 74 very large, thus allowing a limited rotation of the magnets without having to rotate the shield. But maximum flexibility of operation is permitted, of course, when rotation of the shields 67 and 69 is provided over three-hundred-sixty degrees about the respective longitudinal axes of the cylindrically shaped sputtering surfaces 27 and 29.

In order to accomplish such rotation, the shield 67 is provided with a pulley 71 around its circumference near one end, and the shield 69 is similarly provided with a pulley 73. An electrical motor source 75 rotates the shield 67 through a toothed belt 79, and a motor source 77 rotates the shield 69 through a toothed belt 81. The motor sources 75 and 77 are preferably stepper motors and are also controlled by connection with the control system 59.

Figure 2:
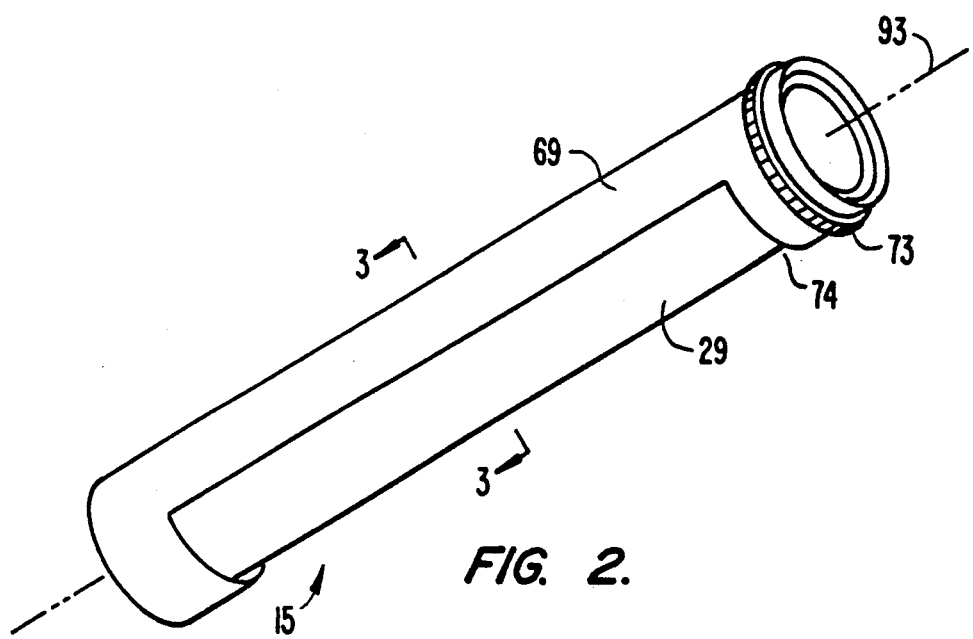
FIG. 2 shows in isometric view a portion of one of the target assemblies of FIG. 1.
Figure 3:
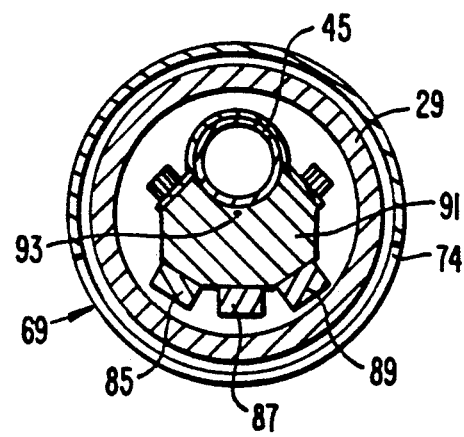
FIG. 3 is a cross-section of a target assembly taken at section 3—3 of FIG. 2.

Additional details of the target assemblies shown in FIG. 1 are apparent from the views of FIGS. 2 and 3 of the target assembly 15. Elongated magnets 85, 87 and 89, of alternate polarity, are carried within the sputtering material cylinder 29 by a support structure 91 that is attached to the coolant tube 45. Each of this magnetic assembly, the sputtering tube 29 and the shield 69 are independently rotatable about a longitudinal axis 93 by respective motor sources 55, 31 and 77.

It will be noted from FIG. 3 that a space exists between an outside surface of the target cylinder 29 and an inside surface of the cylindrically shaped shield tube 69. Both these surfaces are, in cross-section, concentric circles that are separated by a distance that is significantly less than one inch. A small separation is required in order to avoid plasma from forming in the space between these two elements.

Figure 4:
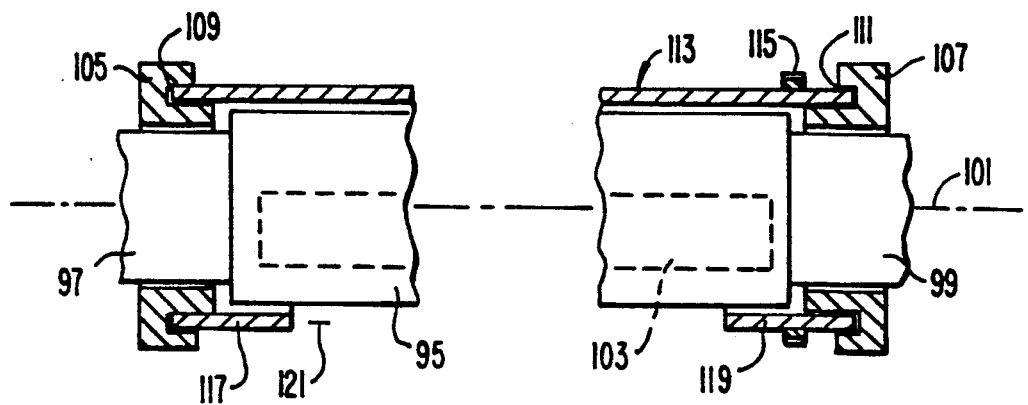
FIG. 4 is a partial sectional view of a preferred support assembly for a rotating target assembly of the type illustrated in FIGS. 1-3.

Referring to FIG. 4, a specific supporting structure for a target assembly is given. A cylindrical sputtering surface 95 is carried through end spindles 97 and 99 in a manner to be rotatable about a longitudinal axis 101. A magnetic structure 103 is positioned within the target cylinder 95. As part of target supporting structures, plates 105 and 107 are provided at opposite ends of the target assembly. These end plates carry respective annular groves 109 and 111 into which a cylindrically shaped shield 113 is inserted at its ends. The shield 113 is then easily rotatable by a motor source connected to a pulley 115.

This support arrangement for the shield 113 also has an advantage of covering portions of the end plates 105 and 107 that are immediately adjacent ends of the sputtering target cylinder 95. These supporting structure surfaces are particularly susceptible to deposition of undesirable films on them, because of their proximity to the plasma sputtering zone, so are very useful for this purpose. Additionally, as previously mentioned, end portions 117 and 119 are circumferentially continuous around the shield and extend far enough along its length to cover respective end portions of the sputtering target 95 where the self-cleaning action of a rotating target act as effectively as it does in more central portions of the target's length. A window 121 is provided, however, in the shield 113 to expose at least the sputtering zone. The shield 113 is preferably made of a material that itself has a low sputtering yield, such as stainless steel.

Although the present invention has been described with respect to a preferred embodiment thereof, it will be understood that the invention is entitled to protection within the full scope of the appended claims.

What is claimed is:

1. In a magnetron having a vacuum chamber including therein at least one target structure with an outer cylindrically shaped surface of sputtering material, said target structure being held by first and second support structures at opposite ends thereof in a manner to be rotatable about a longitudinal axis thereof, and a magnet assembly within the target structure that provides a magnetic field zone extending substantially along a length of said sputtering material surface and extending an arrow circumferential distance therearound, the improvement wherein said first and second support structures each include an annular groove concentric with said target structure longitudinal axis and having a diameter greater than an outside diameter of said sputtering material surface, and comprising a cylindrical shield carried at opposite ends thereof by said first and second support structure annular grooves in a manner to be rotatable about said longitudinal axis independently of said target structure, said shield having an opening at least as large as said magnetic field zone and extending around a portion of its circumference and with a length less than a distance between opposite ends of said target structure sputtering surface.

2. The improved magnetron according to claim 1 wherein said shield is additionally shaped with continuous portions around its circumference at each of its said opposite ends that are positioned to cover said sputtering surface for a distance adjacent each of its said opposite ends and extend over adjacent portions of said first and second support structures.

3. The improved magnetron according to claim 1 which additionally comprises means operably connected to said shield and responsive to a first set of electrical control signals for rotating said shield about said longitudinal axis independent of the target rotation.

4. The improved magnetron according to claim 3 which additionally comprises means operably connected to said magnet assembly and responsive to a second set of electrical control signals for rotating said assembly around said longitudinal axis independent of the target rotation.

5. The improved magnetron according to claim 1 wherein said shield and the sputtering surface is separated by less than one inch.

6. The magnetron according to claim 1 wherein the sputtering surface is connected to a voltage supply, the improvement additionally comprising said shields being connected to substantially ground potential 7. A magnetron adapted to coat films on substrates within a vacuum chamber, comprising:
at least two elongated target structures having cylindrically shaped sputtering surfaces and being held by respective support structures at their ends in a manner to be rotatable about center longitudinal axes thereof that are substantially parallel with each other,
each of said at least two target structures including means within its said cylindrically shaped sputtering surface for providing a magnetic field zone along a length of said sputtering surface and extending a narrow circumferential distance therearound,
means coupled with said target structures for rotating their said sputtering surfaces about their respective axes at a substantially uniform speed,
first electrical means coupled with the magnetic means of each of said at least two target structures for rotating their said magnetic field zones about their respective axes over a set arc and holding them at desired stationary positions within said arc, said magnetic field zones being rotatable independently of each other and of rotation of the target structures,
each of said at least two target structures being provided with a cylindrical shield carried at opposite ends thereof by their respective support structures in a manner to be rotatable about their respective axes independently of the target structures and having an inside diameter thereof that is greater than an outside diameter of said sputtering material surface, each of said shields having an opening at least as large as its respective magnetic field zone and extending around a portion its circumference and less than a length of its respective cylindrical sputtering surface, second electrical means coupled with said shields for rotating their said shields about their respective axis over a set arc and holding them at desired stationary positions within said arc, said shields being rotatable independently of each other and of rotation of the target structures, and control means connected with said first and second electrical means for controlling the rotation and positioning of said magnetic means and said shields.

8. The magnetron according to claim 7 wherein said first and second electrical means includes a separate electrical stepper motor for each of the magnetic means and shields that are rotated thereby.

9. The magnetron according to claim 7 wherein the material composition of each of said at least two sputtering surfaces is different.

10. The magnetron according to claim 7 wherein each of said shields is additionally shaped with continuous portions around its circumference at each of its said opposite ends that are positioned to cover said sputtering surface for a distance adjacent opposite ends thereof and extending over portions of said support structures adjacent thereto.

11. The magnetron according to claim 7 wherein said control means includes means for cooperatively rotating the magnetic means and shield of at least one of the target structures together in a manner that the shield opening follows rotation of the magnetic field zone.

12. A magnetron adapted to coat films on substrates within a vacuum chamber, comprising:

at least one elongated target having a sputtering surface with an outside cylindrical shape of a given diameter and a given length between first and second ends thereof, first and second structures respectively supporting said first and second sputtering surface ends in a manner that allows the target to rotate about a central longitudinal axis thereof, each of said first and second support structures including an annular groove having a diameter greater than said given sputtering surface diameter and a center substantially coincident with said target structure longitudinal axis, means provided within said target for providing a magnetic field zone extending along a length of said sputtering surface and a narrow circumferential distance therearound, a first electrically controlled driving means coupled to said target structure for rotating said sputtering surface through said magnetic field zone, a cylindrically shaped shield surrounding the sputtering surface and having a length greater than that of said given sputtering surface length with first and second ends rotatably carried by the annular grooves of the respective first and second support structures, said shield having a slot opening therein with a circumferential extent at least as large as said magnetic field zone and a length less that of said given sputtering surface length in a manner to substantially solidly cover adjacent portions of the first and second sputtering surface ends and respective first and second support structure portions, and a second electrically controlled driving means coupled to said shield structure for rotating said shield with respect to the support cylindrical surfaces and independently of said target structure, whereby the position of said slot is adjustable.

* * * * *